United States Patent [19]
Satoh et al.

[11] Patent Number: 5,757,061
[45] Date of Patent: May 26, 1998

[54] FERROELECTRIC THIN FILM COATED SUBSTRATE, PRODUCING METHOD THEREOF AND CAPACITOR STRUCTURE ELEMENT USING THEREOF

[75] Inventors: Sakiko Satoh, Yachiyo; Takeshi Kijima, Omiya; Hironori Matsunaga, Noda; Masayoshi Koba, Nara, all of Japan

[73] Assignee: Sharp Kabushiki Kaisha, Osaka, Japan

[21] Appl. No.: 643,302

[22] Filed: May 8, 1996

[30] Foreign Application Priority Data

Jun. 9, 1995 [JP] Japan .................. 7-168119

[51] Int. Cl.$^6$ ............ H01L 29/00; H01L 29/76; H01L 29/94; H01L 31/062
[52] U.S. Cl. .......... 252/532; 257/295; 257/296; 257/303; 257/306; 257/310
[58] Field of Search ................ 257/295, 296, 257/303, 306, 310, 532

[56] References Cited

U.S. PATENT DOCUMENTS

| | | | |
|---|---|---|---|
| 5,270,298 | 12/1993 | Ramesh | 505/1 |
| 5,390,072 | 2/1995 | Anderson et al. | 361/313 |
| 5,519,566 | 5/1996 | Perino et al. | 361/321.4 |
| 5,548,475 | 8/1996 | Ushibubo et al. | 361/321.4 |
| 5,576,564 | 11/1996 | Satoh et al. | 257/295 |

FOREIGN PATENT DOCUMENTS

| | | |
|---|---|---|
| 3 108 192 | 5/1991 | Japan . |
| 3 108 770 | 5/1991 | Japan . |
| 5 235 268 | 9/1993 | Japan . |
| WO 93/12538 | 6/1993 | WIPO . |
| WO 94/10702 | 5/1994 | WIPO . |

OTHER PUBLICATIONS

Extended Abstracts, The Japan Society of Applied Physics, The 55th Autumn Meeting, 1994 (20p–M–19).
Extended Abstracts, The Japan Society of Applied Physics, The 42nd Spring Meeting, 1995 (29p–D–2).
Extended Abstracts, The Japan Society of Applied Physics, The 42nd Spring Meeting, 1995 (29p–D–3).
Extended Abstracts, The Japan Society of Applied Physics, The 56th Autumn Meeting, 1995 (27a–ZG–2).
Extended Abstracts, The Japan Society of Applied Physics, The 56th Autumn Meeting, 1995 (27a–ZG–3).
Extended Abstracts, The Japan Society of Applied Physics, The 43rd Spring Meeting, 1996 (28p–V–11).
G.A. Smolenskii et al., Soviet Phys. Solid State, A New Group of Ferroelectrics, 1, 149–51, 1959.
E.C. Subbarao, J. Phys. Chem. Solids, A Family of Ferroelectric Bismuth Compounds, 23, 665–76, 1962.
S. Onishi et al., IEEE IEDM Technical Digest, A Half–Micron Ferroelectric Memory Cell . . . , pp. 843–846, 1994.
Takashi Nakamura, Integrated Ferroelectrics, Preparation of $Bi_4Ti_3O_{12}$ Films . . . , vol. 6, pp. 35–46 (1995).
H. Matsunaga et al., Chemical Abstracts 12:248134 (1996).
Preparation of C–Axis–Oriented Bi4Ti3O12 Thin Films by Metalorganic Chemical Vapor Deposition, Takashi Nakamura Extended Abstracts, et al, Jpn. J. Appl. Phys. vol. 32 (1993) pp. 4086–4088 Part 1, No. 9b, Sep. 1993.

(List continued on next page.)

*Primary Examiner*—Wail Fahmy
*Assistant Examiner*—Howard Weiss
*Attorney, Agent, or Firm*—Birch, Stewart, Kolasch & Birch, LLP

[57] ABSTRACT

A ferroelectric thin film coated substrate is obtained by a producing method of forming a crystalline thin film on a substrate by means of a MOCVD method at a substrate temperature at which crystal grows and of forming a ferroelectric thin film on the crystalline thin film by means of the MOCVD method at a film forming temperature, which is lower than the film forming temperature of the crystalline thin film. This producing method makes it possible to produce a ferroelectric thin film, where a surface of the thin film is dense and even, leakage current properties are excellent and sufficiently large remanent spontaneous polarization is shown, at a lower temperature.

13 Claims, 4 Drawing Sheets

OTHER PUBLICATIONS

Ultra–Thin Fatique Free Bi4Ti3012 Thin Film for Nonvolatile Ferroelectric Memories T. Kijima et al, Extended Abstracts of the 1995 International Conference on Solid State Devices and Materiala, Osaka, 1995, pp. 1071–1072.

Ultra–Thin Fatique–Free Bi4Ti3012 Films for nonvolatile Ferroelectric Memories, Takeshi Kijima et al, Jpn. J. Appl. Phys. vol. 35 (1996) pp. 1246–1250, Part 1, No. 2B, Feb. 1996.

Preparation of B14Ti3012 Thin Films with c–axis Orientation by MOCVD Using Bi(oOC7H7)3 and Ti (i–Oc3H7) 2 (DPM)2, Kuniaki Yoshimura et al, Journals of the Ceramic Society of Japan 102 [5] 512–515 (1994).

Thin Solid Films, vol. 259, No. 2, pp. 264–269, XP000512226 JIA Q X et al: "Low Leakagge Current BAT103 Thin Film Capacitors Using a Multilayer Construction", Apr. 15, 1995.

Japanese Journal of Applied Physics, vol. 32, No. 98, pp. 4086–4088, XP000573227, Nakamura T. et al., "Preparation of C–Axis–Oriented B14T13012 Thin Films by Metalorganic Chemical Vapor Deposition", Sep. 1, 1993.

VERTICAL AXIS/SCALE: 6.5 μC/cm²
HORIZONTAL AXIS/SCALE: 150 kV/cm

FERROELECTRIC THIN FILM COATED SUBSTRATE, PRODUCING METHOD THEREOF AND CAPACITOR STRUCTURE ELEMENT USING THEREOF

FIELD OF THE INVENTION

The present invention relates to a ferroelectric thin film coated substrate to be used in a ferroelectric memory device, a pyroelectric sensor device, a piezoelectric device, etc., a producing method thereof, and a capacitor structure element using the ferroelectric thin film coated substrate.

BACKGROUND OF THE INVENTION

Since ferroelectrics has a lot of advantages, such as spontaneous polarization, high dielectric constant, an electro-optic effect, a piezoelectric effect and a pyroelectric effect, it is applied to the development of various devices, such as a capacitor, an oscillator, a light modulator and an infrared sensor. Conventionally, in these applications, monocrystal, which is made of triglycine sulfate (TGS), $LiNbO_3$ and $LiTaO_3$ which are materials of the ferroelectrics, or ceramics, which are made of $BaTiO_3$, $PbTiO_3$, $Pb(Zr_{1-x}Ti_x)O_3$ (PZT), PLZT, etc., was cut and was ground so as to have a thickness of approximately 50 μm. However, it is difficult and costly to produce large-sized monocrystal, and its processing is difficult due to cleavage. Moreover, since ceramics are generally fragile and it is difficult to process the ceramics so that it has a thickness of less than 50 μm due to a crack, etc. at a processing step. Therefore, a lot of effort is required and its production cost becomes higher.

Meanwhile, as a technique for forming a thin film is developed, an application field for such a ferroelectric thin film is spreading at present. As an example of the applications, when high dielectric constant properties are applied to a capacitor for various semiconductor devices, such as DRAM, high integration of a picture element is realized by decreasing the capacitor size and reliability is improved. Especially, a high density ferroelectric nonvolatile memory (FRAM) which is operated at high speed has been developed by combining a ferroelectric thin film and a semiconductor memory element, such as DRAM, recently. The ferroelectric nonvolatile memory does not require backup battery by utilizing the ferroelectric properties (hysteresis effect) of the ferroelectrics. The development of these devices require materials which have properties, such as large remanent spontaneous polarization (Pr), a small coercive electric field (Ec), a low leakage current and excellent endurance to repetition of polarization reversal. Moreover, in order to lower an operating voltage and to suitably perform a semiconductor fine processing, it is desirable that the above properties are realized by a thin film with a thickness of less than 200 nm.

In order to achieve the application of the ferroelectric thin film to the FRAM, etc., an oxide ferroelectric thin film having a perovskite structure, such as $PbTiO_3$, PZT and PLZT, is tried to be formed by thin film forming method, such as sputtering method, vacuum evaporation method, sol-gel method and MOCVD (Metal-Organic Chemical Vapor Deposition) method.

In the above ferroelectric materials, $Pb(Zr_{1-x}Ti_x)O_3$ (PZT) is now being studied most intensively, and a thin film with excellent ferroelectric properties is obtained by the sputtering method and the sol-gel method. For example, a thin film, whose remanent spontaneous polarization Pr takes a large value in the range of 10 μC/cm² to 26 μC/cm², is obtained. However, although the ferroelectric properties of PZT greatly depend upon a composition x, PZT contains Pb whose vapor pressure is high, so decrease in a film thickness arises a problem that the leakage current and fatigue in the endurance to polarization reversal are caused because film compositions are liable to change at the time of film formation and of heat treatment, a pinhole is produced, a low dielectric constant layer is created due to reacting between a ground electrode Pt and Pb, etc. For this reason, it is desired that another materials whose ferroelectric properties and the endurance to polarization reversal are excellent are developed. Moreover, in the case of the application to an integrated device, a fine grain thin film, which corresponds to fine processing, is required.

Bi layered oxide materials such as $SrBi_2Ta_2O_9$ has attracted interest as the materials with fatigue free property. A thin film of $SrBi_2Ta_2O_9$ is produced by a MOD method. The MOD method is a method for forming a film including the following, processes. Namely, like the solgel method, metalorganic raw materials are mixed so that a fixed film composition is obtained, and a raw material solution for application whose concentration and viscosity are adjusted is produced. A substrate is spincoated with the produced raw material solution and the substrate is dried. Then, in order to remove the organic element and solvent, the substrate is heated to form the amorphous film. These processes are repeated until the fixed film thickness is obtained, and finally, the substrate is crystallized by sintering. Therefore, the film thickness is controlled by adjusting the thickness of a once-applied film (see Extended Abstracts (the 55th Autumn Meeting 1994): The Japan Society of Applied Physics, 20P-M-19).

The most serious problem of $SrBi_2Ta_2O_9$ thin film formation is that since the sintering temperature is very high, namely 750° C.–800° C., a long sintering time, namely, longer than 1 hour, is required. In such a manufacturing process, when the processes, such as film formation and heat treatment are performed for a long time at the temperature of not lower than 650° C., a mutual diffusion reaction between a platinum metal electrode as a substrate and the ferroelectrics and reactions between silicon or an oxidized silicon under the ground electrode and the electrode or the ferroelectrics are taken place. Moreover, the film composition is changed due to volatilization of a composition element from the ferroelectric thin film, and thus the application to the actual device producing process becomes difficult. Moreover, since only a film, whose surface morphology is composed of a large grain size of approximately 0.3 μm, is obtained at present, the film cannot be applied to the submicron fine processing which is required for the development of highly integrated devices. Moreover, in the case of the coated film, since a coating method is disadvantageous of a step coverage is different, there arises a problem of disconnection of a wiring, etc. Therefore, as to $SrBi_2Ta_2O_9$, its ferroelectric properties and its fatigue free property are excellent, but it still has a serious problem for application to devices.

In addition, in order to realize high integration of the ferroelectric nonvolatile memory at present, it is examined to use polycrystal silicon plug for a wiring between a MOS transistor and a ferroelectric capacitor, but in the case where a ferroelectric thin film is produced by a long-time and high temperature process used for $SrBi_2Ta_2O_9$, there arises a problem that its properties are deteriorated due to counter diffusion between the polycrystal silicon for a wiring and the ferroelectric thin film. In order to solve such a problem, a structure where various diffusion barrier layers are inserted is examined, but even in such a structure, the permitted limit of a forming temperature of the ferroelectric thin film is up to 650° C., and on another short-time heat treatment process, the permitted limit is up to approximately 700° C. However, at present in the ferroelectric thin film made of $SrBi_2Ta_2O_9$ or the like, in general, as the film forming temperature is higher, the ferroelectric properties as well as crystallinity are more improved. Therefore, when the film forming temperature is lowered, the crystallinity and the ferroelectric properties are deteriorated, so it is difficult to achieve both the improvement in the ferroelectric properties and the low film forming temperature in the ferroelectric thin film.

On the other hand, an example of ferroelectrics oxide excluding Pb, which exerts a bad influence upon the leakage current and the resistance to polarization reversal, is $Bi_4Ti_3O_{12}$ having a layered perovskite structure. Such $Bi_4Ti_3O_{12}$ is ferroelectrics having the layered perovskite structure whose anisotropy is strong (orthorhombic system/lattice constants: a=5.411 Å, b=5.448 Å, c=32.83 Å), and the ferroelectricity of its monocrystal has the largest spontaneous polarization among the above Bi oxide ferroelectrics in a-axis direction in which remanent spontaneous polarization Pr is 50 μC/cm², and a coercive electric field Ec is 50 kV/cm, so $Bi_4Ti_3O_{12}$ shows excellent properties. Therefore, in order to apply the large spontaneous polarization of $Bi_4Ti_3O_{12}$ to the ferroelectric nonvolatile memory, etc., it is desirable that $Bi_4Ti_3O_{12}$ has a lot of a-axis composition of the crystal in the direction which is perpendicular to the substrate.

Thinning of $Bi_4Ti_3O_{12}$ thin film has been tried to produce by the MOCVD method and the sol-gel method, but these attempts mostly brought c-axis oriented films whose spontaneous polarization is smaller than a-axis oriented films. Moreover, in the conventional sol-gel method, the heat treatment of not lower than 650° C. is required for obtaining the excellent ferroelectric properties, and since its surface morphology is composed of crystal grains of approximately 0.5 μm, it is difficult to apply the thin film to the highly integrated devices which requires fine processing.

Meanwhile, a $Bi_4Ti_3O_{12}$ thin film with c-axis orientation is formed by the MOCVD method on a $Pt/SiO_2/Si$ substrate and a Pt substrate at a substrate temperature of not lower than 600° C., but these substrates cannot be directly applied to an actual device structure. In other words, like the $Pt/Ti/SiO_2/Si$ substrate, an adhesive layer, such as a Ti film, is required for obtaining adhesive strength between a Pt electrode layer and $SiO_2$ below it. However, in the case where the $Bi_4Ti_3O_{12}$ thin film is formed by the MOCVD method on the Pt electrode substrate to which such an adhesive layer is provided, it is reported that its film surface morphology is composed of coarse crystal grains and that a pyrochlore phase ($Bi_2Ti_2O_7$) is liable to occur (see Jpn. J. Appl. Phys., 32, 1993, pp.4086, and J. Ceramic Soc. Japan, 102, 1994, pp.512). In the case where the film surface morphology is composed of coarse crystal grains, the film cannot be applied to the highly integrated devices which require fine processing, and furthermore, a thin thickness causes a pinhole, thereby generating a leakage current. Therefore, in such a conventional technique, it is difficult to realize the ferroelectric thin film which has a thin film thickness of not more than 200 nm and has excellent ferroelectric properties.

As mentioned above, in order to apply a ferroelectric thin film to highly integrated devices, the above prior art cannot provide a ferroelectric thin film, which sufficiently fulfills various conditions, such as denseness and flatness on the thin film surface required for fine processing and a low leakage current, large remanent spontaneous polarization, and a film forming process at a low temperature.

SUMMARY OF THE INVENTION

It is an object of the present invention to provide a ferroelectric thin film coated substrate, where a ferroelectric thin film with a dense and even surface, excellent low leakage current properties and sufficiently large remanent spontaneous polarization, can be produced at a lower temperature, a method of producing the ferroelectric thin film coated substrate and a capacitor structure element using the ferroelectric thin film coated substrate.

In order to achieve the above object, a ferroelectric thin film coated substrate of the present invention is produced by the following characteristic steps of:

forming a crystalline thin film on a substrate at a first substrate temperature at which crystal grows; and forming a ferroelectric thin film on the crystalline thin film at a second substrate temperature which is lower than the first substrate temperature.

In accordance with the above arrangement, since the ferroelectric thin film is positioned by intervention of the crystalline thin film composed of crystal grains with small particle diameter as an initial nucleation layer, even when a ferroelectric thin film with a larger film thickness is formed at a film forming temperature (substrate temperature) which is lower than a film forming temperature (substrate temperature) of the crystalline thin film, sufficient ferroelectricity can be secured due to inheritance of excellent crystallinity of the crystalline thin film. Moreover, when the ferroelectric thin film is formed at a lower temperature, the crystal grains composing the thin film can be prevented from becoming rough and large, thereby making it possible to obtain the dense ferroelectric thin film whose surface is even.

In other words, when the ferroelectric thin film coated substrate of the present invention is arranged so that the ferroelectric thin film with an enough film thickness to show ferroelectricity is placed on the substrate through the crystalline thin film composed of crystal grains with a smaller particle diameter, the ferroelectric thin film which has sufficient ferroelectricity and has excellent evenness and denseness can be obtained.

In addition, in the ferroelectric thin film coated substrate of the present invention, since the ferroelectric thin film has excellent evenness and denseness, fine processing becomes possible, and the substrate is applicable to various highly integrated devices. Moreover, if the substrate is applied to various devices including the capacitor structure element of the present invention, production of a pin hole is prevented, thereby making it possible to improve the leakage current properties.

It is desirable that the ferroelectric thin film coated substrate of the present invention is produced by forming the crystalline thin film on the substrate by means of the MOCVD method at a substrate temperature at which crystal grows, and by forming the ferroelectric thin film at a substrate temperature which is lower than the film forming temperature of the crystalline thin film. This is because since the crystal grains composing the ferroelectric thin film are grown by letting the crystalline thin film function as an initial nuclear layer, namely, letting the crystal grains composing the crystalline thin film function as a nucleus, the ferroelectric thin film where sufficient ferroelectricity is maintained, and evenness and denseness are excellent can be obtained.

In addition, it is desirable that the substrate temperature in forming the crystalline thin film (first substrate temperature) is in the range of 450° C. to 650° C., and the substrate temperature in forming the ferroelectric thin film (second substrate temperature) is in the range of 400° C. to 500° C. (however, the range of 450° C. to 500° C. is limited to the case where the second substrate temperature is lower than the first substrate temperature).

In the producing method of the present invention, the substrate temperature in forming the crystalline thin film is slightly higher, but it is enough lower compared with the conventional method, and the process for forming the crystalline thin film requires a short time because its thickness may thin. Therefore, there is little effect of the substrate temperature.

Therefore, in accordance with the method of producing the ferroelectric thin film coated substrate of the present invention, since the ferroelectric thin film is formed at a very low temperature during almost whole process, the substrate is applicable to a highly integrated device provided with a plurality of elements without damaging another elements, and furthermore, a degree of freedom in design can be remarkably improved.

For fuller understanding of the nature and advantages of the invention, reference should be made to the ensuing detailed description taken in conjunction with the accompanying drawings.

DETAILED DESCRIPTION OF THE PREFERRED EMBODIMENTS

The following describes one embodiment of the present invention on reference to FIGS. 1 through 5.

Figure 1:
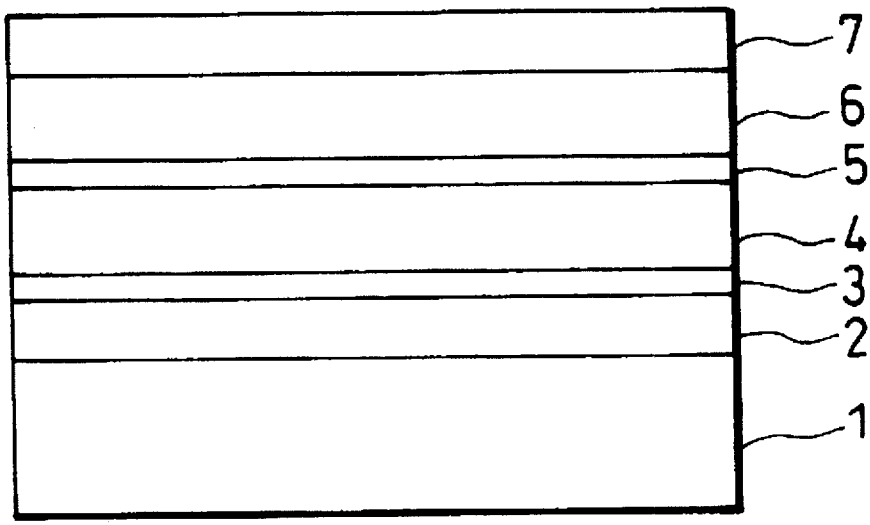
FIG. 1 is a schematic cross sectional view which shows an arrangement of a capacitor structure element using a ferroelectric thin film coated substrate according to embodiment of the present invention.

FIG. 1 is a drawing which shows an arrangement of a capacitor structure element according to the first embodiment of the present invention. As shown in FIG. 1, the capacitor structure element is arranged so that a silicon oxide ($SiO_2$) layer 2, an adhesive layer 3, a lower electrode 4, a crystalline thin film 5, a ferroelectric thin film 6, and an upper electrode 7 are formed on a silicon (Si) substrate 1 in this order.

In the first embodiment, a silicon monocrystal wafer is used as the silicon substrate 1, and a silicon oxide thin film obtained by thermally oxidizing the surface of the silicon monocrystal wafer is used as the $SiO_2$ layer 2. Moreover, a tantalum (Ta) thin film as the adhesive layer 3, a platinum (Pt) thin film as the lower electrode 4, a bismuth titanate thin film as the crystalline thin film 5, a bismuth titanate thin film as the ferroelectric thin film 6, and a platinum (Pt) thin film as the upper electrode 7 are used.

Next, the following describes a method of producing the capacitor structure element of the first embodiment shown in FIG. 1.

At first, a method for producing a Pt/Ta/SiO$_2$/Si substrate is described. The surface of the silicon monocrystal wafer (100) as the silicon substrate 1 is thermally oxidized so that the $SiO_2$ layer 2 with thickness of 200 nm is formed. Then, the Ta thin film as the adhesive layer 3 and the Pt thin film as the lower electrode 4 are formed by a sputtering method so that they respectively have a thickness of 30 nm and a thickness of 200 nm.

Here, the materials and the film thicknesses are not necessarily limited to the embodiment. For example, a silicon polycrystal substrate, a GaAs substrate, etc. may be used instead of the silicon monocrystal substrate. The adhesive layer 3 prevents peeling of a film due to a difference in the coefficient of thermal expansion between the substrate and the lower electrode 4 during film forming, and its film thickness may take any value as long as it can prevent the peeling of a film. Moreover, titanium (Ti) etc. can be used as its material instead of Ta, but in the present embodiment, use of Ta is desirable because the use of Ti produces alloy of Ti and Pt. Furthermore, the $SiO_2$ layer used as an insulating layer is not necessarily formed by thermal oxidation, so an $SiO_2$ film, a silicon nitride film etc., which are formed by the sputtering method, a vacuum evaporation method, a MOCVD method, etc., can be used, and their materials and film thicknesses may take any values as long as they have sufficient insulation.

In addition, the lower electrode 4 may have any film thickness as long as it can function as an electrode layer. Its material is not necessarily limited to Pt, so it may be a conductive material to be used as an usual electrode material, so the material can be suitably selected according to the relation with another thin films. Moreover, the film forming method of forming the lower electrode 4 is not necessarily limited to the silicon thermal oxidation and the sputtering method, so it can be formed by usual thin film forming technique, such as the vacuum evaporation method. Moreover, the structure of the substrates is not necessarily limited to the above.

Here, a particle diameter of crystal grains composing the bismuth titanate thin film and its crystallinity with respect to the temperature of the Pt/Ta/SiO2/Si substrate produced in the above manner were examined when the bismuth titanate thin film to be used as the crystalline thin film 5 was formed by the MOCVD method in the present embodiment.

The temperature of the substrate (film forming temperature) was varied to 400° C., 450° C., 500° C., 550° C., 600° C. and 650° C., and the bismuth titanate thin film as the crystalline thin film was formed on the Pt/Ta/SiO2/Si substrate by the MOCVD method under the conditions of a raw material shown in Table 1 so as to have a film thickness of 100 nm.

TABLE 1

| Raw material | Bi(o-C$_7$H$_7$)$_3$ | Ti(i-OCH$_3$H$_7$)$_4$ |
| --- | --- | --- |
| Temperature of raw material | 160° C. | 50° C. |
| Flow rate of carrier gas (Ar) | 200 sccm | 100 sccm |
| Flow rate of reaction gas (O$_2$) | | 1000 sccm |
| Film forming pressure | | 5 Torr |

As shown in TABLE 1, when the bismuth titanate thin film was formed, tri-o-tolyl bismuth (Bi(o-C$_7$H$_7$)$_3$) as a bismuth raw material and titanium (IV) tetra-i-propoxide (Ti(i-OC$_3$H$_7$)$_4$) as a titanium raw material were used, and these raw materials were respectively heated and vaporized so as to be at temperatures of raw materials shown in TABLE 1 (bismuth raw material: 160° C., a titanium raw material: 50° C.). Then, they were supplied to a film forming chamber together with argon (Ar) gas as carrier gas and gaseous oxygen ($O_2$) as reaction gas. Here, the flow rate of the Ar gas was 200 sccm with respect to the Bi raw material and was 100 sccm with respect to the Ti raw material. The flow rate of the $O_2$ gas was 1000 sccm. Here, in the film forming process, when a gas pressure in the film forming chamber is not lower than 10 Torr, gas phase reaction is liable to produce, so the gas pressure was 5 Torr.

A particle diameter of crystal grains and crystallinity in the bismuth titanate thin film formed in the above manner were examined by AFM (Atomic Force Microscope) and the X-ray diffraction. The examined results are shown in TABLE 2. Here, the diameter of the crystal grains was obtained from an irregular shape of the thin film surface by the AFM measurement. According to TABLE 2, as the film forming temperature (substrate temperature) becomes higher, the diameter of the crystal grains becomes larger.

TABLE 2

| Film forming temperature (°C.) | 400 | 450 | 500 | 550 | 600 | 650 |
|---|---|---|---|---|---|---|
| Diameter of crystal grains (nm) | 50 | 80 | 100 | 150 | 250 | 300 |
| Crystallinity | Amorphous | Pyrochlore phase $Bi_2Ti_2O_7$ (111) orientation | Pyrochlore phase $Bi_2Ti_2O_7$ + layered Perovskite $Bi_4Ti_3O_{12}$ | | Layered Perovskite $Bi_4Ti_3O_{12}$ (random orientation) | C-axis orientation $Bi_4Ti_3O_{12}$ |

In the present embodiment, the crystalline thin film 5 is used as an initial nuclear layer of the ferroelectric thin film 6, namely, the crystal grains composing the crystalline thin film 5 are used as initial nuclear of the crystal grains composing the ferroelectric thin film 6. As a result, according to TABLE 2, the thin film, which shows crystallinity and has the substrate temperature of not lower than 450° C., is effective. In order to obtain a large remanent polarization value in the ferroelectric thin film 6 to be formed on the crystalline thin film 5, $Bi_4Ti_3O_{12}$ showing ferroelectricity is preferable to pyrochlore phase $Bi_2Ti_2O_7$ showing paraelectricity. Moreover, in $Bi_4Ti_3O_{12}$, since the random orientation including an a-axis orientation composition showing a large remanent polarization value is preferable to the c-axis orientation, in the first embodiment, the $Bi_4Ti_3O_{12}$ thin film was formed at substrate temperature of 600° C. as the crystalline thin film 5.

In addition, the bismuth titanate $Bi_4Ti_3O_{12}$ thin films with thicknesses of 5 nm, 10 nm, 25 nm, 50 nm and 100 nm were formed on the Pt/Ta/SiO$_2$/Si substrate at the substrate temperature of 600° C. under the film forming conditions that are same as of the MOCVD method. The evenness of the thin film surfaces was also examined. The results are shown in TABLE 3.

As shown in TABLE 3, as the film thickness becomes larger, the size of the crystal grains becomes larger.

TABLE 3

| Film thickness | 5 nm | 10 nm | 25 nm | 50 nm | 100 nm |
|---|---|---|---|---|---|
| Diameter of crystal grain (nm) | 5 | 5 | 20 | 100 | 250 |

In order to obtain excellent evenness and denseness of the ferroelectric thin film 6, in the present embodiment, the $Bi_4Ti_3O_{12}$ thin film with the film thickness of 5 nm, namely, the smallest particle diameter of 5 nm, is preferable as the crystalline thin film 5.

According to these results, in the first embodiment, the $Bi_4Ti_3O_{12}$ thin film with the film thickness of 5 nm, which was produced by the MOCVD method at substrate temperature of 600° C., was used as the crystalline thin film 5.

After the $Bi_4Ti_3O_{12}$ crystalline thin film 5 with the film thickness of 5 nm was formed on the Pt/Ta/SiO$_2$/Si substrate at substrate temperature of 600° C. by the MOCVD method, the ferroelectric thin film 6 was formed on the $Bi_4Ti_3O_{12}$ crystalline thin film 5. In the first embodiment, a thin film, which is made of bismuth titanate $Bi_4Ti_3O_{12}$ composed of the same elements as those of the bismuth titanate $Bi_4Ti_3O_{12}$ thin film as the crystalline thin film 5, was used as the ferroelectric thin film 6. When the ferroelectric $Bi_4Ti_3O_{12}$ thin film was formed, the MOCVD method was used, and the film forming conditions were entirely same as those of the above $Bi_4Ti_3O_{12}$ crystalline thin film except for the substrate temperature. The substrate temperature was 400° C. which is lower than the substrate temperature of 600° C. of the $Bi_4Ti_3O_{12}$ crystalline thin film. The ferroelectric $Bi_4Ti_3O_{12}$ thin film with the film thickness of 95 nm was formed under the above conditions. Therefore, the total film thickness of the $Bi_4Ti_3O_{12}$ thin films, namely, the crystalline thin film 5 and the ferroelectric thin film 6, in the first embodiment becomes 100 nm. In the present embodiment, the time required for forming the $Bi_4Ti_3O_{12}$ crystalline thin film was about 2 minutes, and the time required for forming the ferroelectric $Bi_4Ti_3O_{12}$ thin film was about 1 hour.

Next, the surface of the ferroelectric $Bi_4Ti_3O_{12}$ thin film formed in such a manner was measured by means of the AFM. As a result, the particle diameter of the crystal grain was 50 nm, and it was larger than the particle diameter (5 nm) of the crystalline thin film 5. For comparison, a $Bi_4Ti_3O_{12}$ thin film with the film thickness of 100 nm was formed by the MOCVD method at the substrate temperature of 600° C. Here, the film forming conditions were same as those in the present embodiment except for the substrate temperature. As a result, the particle diameter of the thin film became 300 nm, and it is found that the particle diameter of the $Bi_4Ti_3O_{12}$ thin film of the present embodiment is decreased to ⅙ compared to the $Bi_4Ti_3O_{12}$ thin film not having the crystalline thin film 5.

Figure 2:
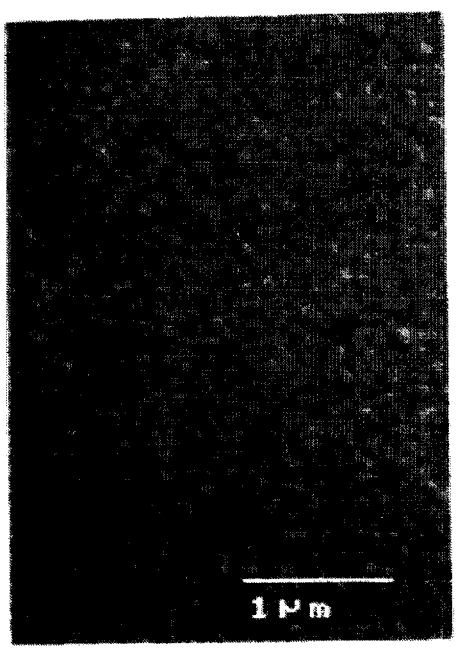
FIG. 2 is a photograph which shows a result of examining a surface of a ferroelectric $Bi_4Ti_3O_{12}$ thin film of the first embodiment by means of SEM (Scanning Electron Microscope).

In addition, the results of observing the surface of the ferroelectric $Bi_4Ti_3O_{12}$ thin film of the present embodiment by means of SEM (Scanning Electron Microscope) are shown in FIG. 2. According to FIG. 2, the dense and even thin film is obtained, and this corresponds to the results of the measurement by the AFM.

Figure 3:
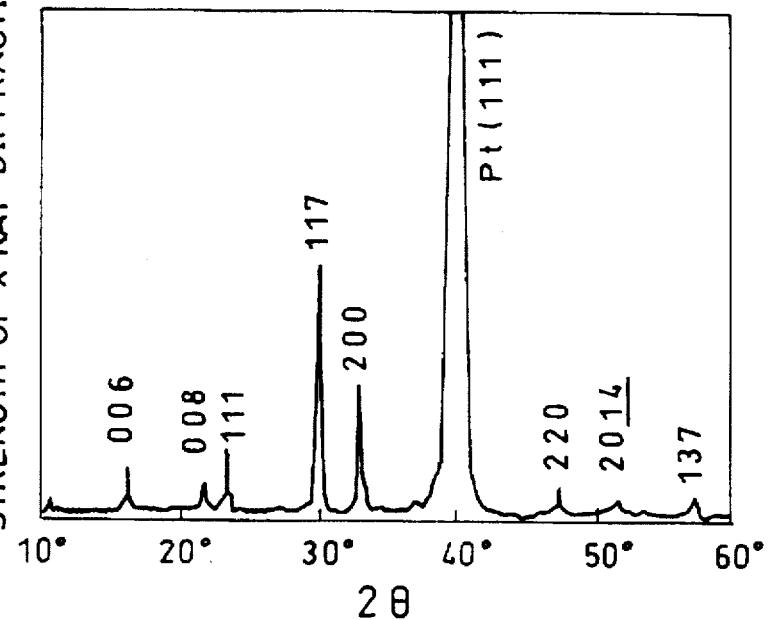
FIG. 3 is a drawing which shows observation results of a $Bi_4Ti_3O_{12}$ thin film, which is a ferroelectric thin film of the above ferroelectric thin film coated substrate by X-ray diffraction.
Figure 4:
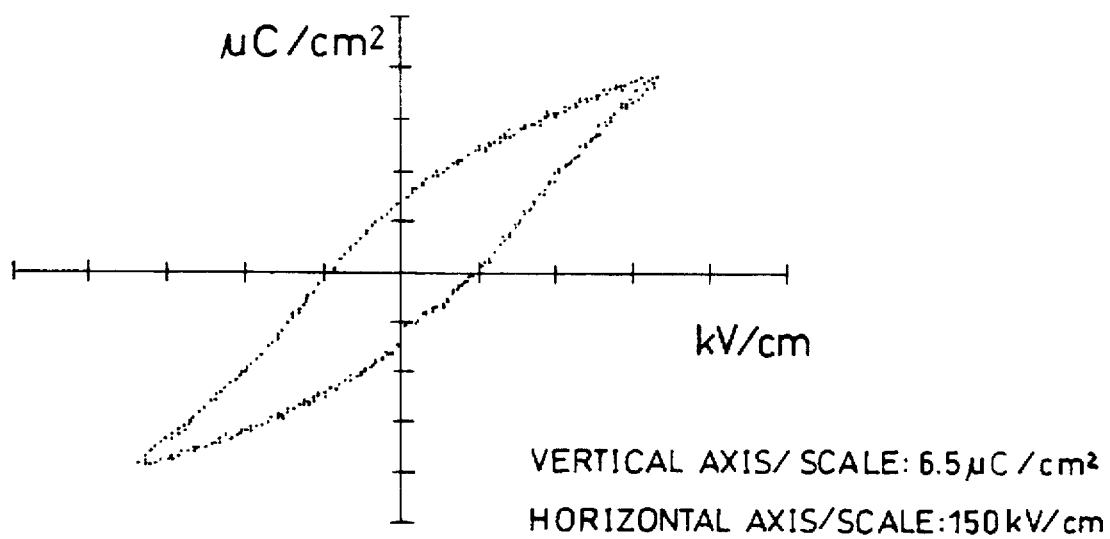
FIG. 4 is a graph which shows a ferroelectric hysteresis curve of the capacitor structure element.

Results of examining the crystallinity of the ferroelectric $Bi_4Ti_3O_{12}$ thin film in the present embodiment by means of the X-ray diffraction are shown in FIG. 3.

In FIG. 3, the vertical axis represents the intensity of the X-ray diffraction, and the horizontal axis represents a diffraction angle 2θ (deg). (001) (1 is integer) represents the diffraction peak due to the c-axis orientation of $Bi_4Ti_3O_{12}$, and (200) represents the diffraction peak due to the a-axis orientation of $Bi_4Ti_3O_{12}$. (111), (117), (220), (2014) and (137) respectively represent the diffraction peak due to the random orientation including the a-axis composition of $Bi_4Ti_3O_{12}$, the diffraction peak of Pt (111) in the vicinity of 2θ=40° (deg) is due to Pt of the lower electrode 4.

According to the pattern of the X-ray diffraction in FIG. 3, $Bi_4Ti_3O_{12}$ in which the a-axis orientation, the c-axis orientation and the random orientation are mixed, namely, which has a random orientation composition, was formed in the ferroelectric thin film 6 of the present embodiment. As a result, it was confirmed that the ferroelectric $Bi_4Ti_3O_{12}$ thin film with the random orientation was formed on the $Bi_4Ti_3O_{12}$ crystalline thin film with the random orientation in the first embodiment.

For comparison, the Pt/Ta/SiO$_2$/Si substrate, which is same as that of the first embodiment, was used, and the bismuth titanate thin film was formed just on Pt under the same condition (substrate temperature of 400° C.) as the above ferroelectric $Bi_4Ti_3O_{12}$ thin film. The formed bismuth titanate thin film shows an amorphous structure. Namely, unlike the present embodiment, in the thin film where the above crystalline thin film was not formed, the bismuth titanate thin film was not crystallized and the amorphous structure was obtained. This makes it clear that the crystalline thin film 5 of the present embodiment makes it possible to form the ferroelectric thin film 6 showing crystallinity at the very low substrate temperature of 400° C., at which the bismuth titanate thin film is not usually crystallized. The effects of the present embodiment are produced since the ferroelectric thin film 6 inherits the crystal state from the crystalline thin film 5 with thin film thickness and the crystal growth is promoted.

The $Bi_4Ti_3O_{12}$ crystalline thin film and the ferroelectric $Bi_4Ti_3O_{12}$ thin film are successively formed on the Pt/Ta/SiO$_2$/Si substrate, and a Pt electrode (100 μm$^2$) as the upper electrode 7 was formed thereon by the vacuum evaporation method so that a capacitor structure element shown in FIG. 1 was produced.

Here, the produced upper electrode 7 also may have any film thickness as long as it functions as an electrode like the lower electrode 2, and its material is not necessarily limited to Pt, so a conductive material for an usual electrode material may be used. Moreover, as to the film forming method, the sputtering method as well as the vacuum evaporation method can be used.

A voltage was applied across the lower electrode 4 and the upper electrode 7 shown in FIG. 1, and the ferroelectric properties of the capacitor structure element in the present embodiment was evaluated. Its result was represented by a ferroelectric hysteresis curve shown in FIG. 4. In other words, when the voltage of 3 V is applied, the capacitor structure element in the present embodiment shows the properties having large remanent spontaneous polarization of 9 μC/cm$^2$ and the coercive electric field Ec of 140 kV/cm although the total film thickness of the $Bi_4Ti_3O_{12}$ thin films was very thin, namely, 100 nm. This value of the remanent spontaneous polarization Pr is not less than twice as large as Pr of 4 μC/cm$^2$ in the c-axis direction which is obtained in $Bi_4Ti_3O_{12}$ monocrystal (bulk).

A reason that the capacitor structure element in the present embodiment obtains the large remanent spontaneous polarization Pr of 9 μC/cm$^2$ is as follows. Namely, the value of Pr in the a-axis direction of the $Bi_4Ti_3O_{12}$ is larger than the value in the c-axis direction, and the ferroelectrics $Bi_4Ti_3O_{12}$ with the random orientation is shown by the examination through the X-ray diffraction in the present embodiment. Therefore, the a-axis orientation composition of the $Bi_4Ti_3O_{12}$ ferroelectrics greatly contributes to the large remanent spontaneous polarization.

Figure 5:
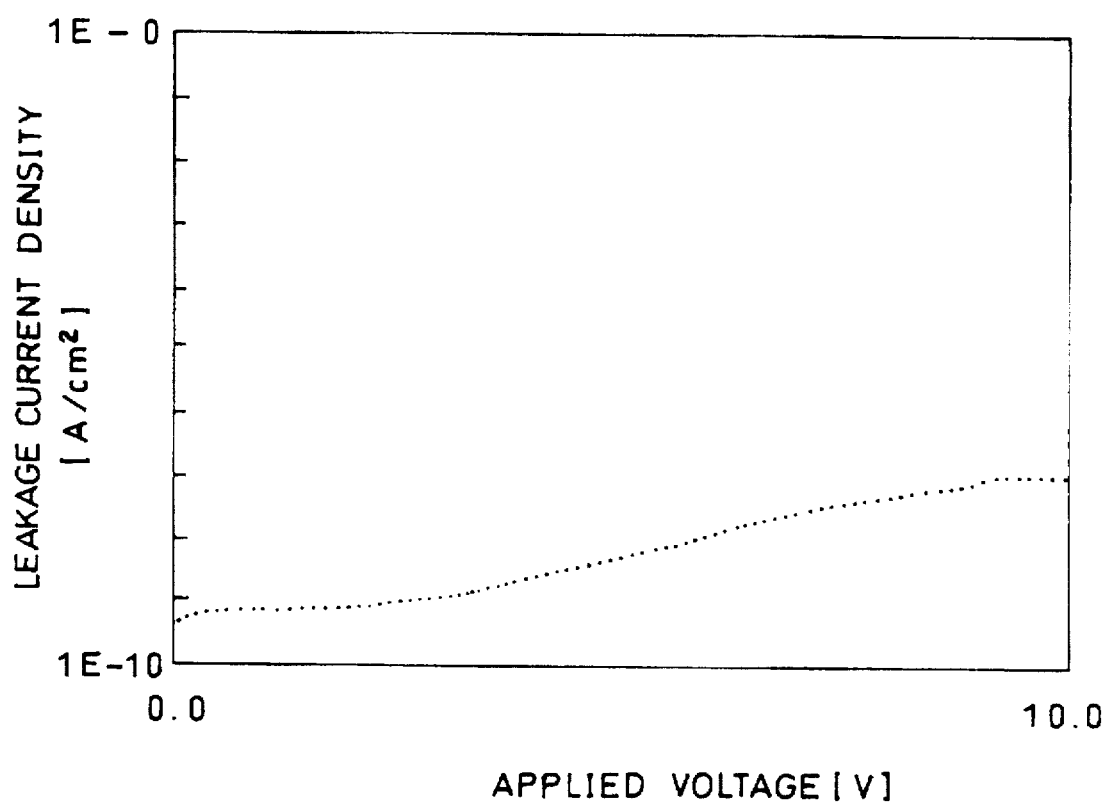
FIG. 5 is a graph which shows an applied voltage dependency of a leakage current density of the capacitor structure element.

In addition, in the capacitor structure element in the present embodiment, a leakage current density Il was measured, and its result is shown in FIG. 5. When a voltage of 3 V is applied, the leakage current density Il took a very small and favorable value of $8 \times 10^{-9}$ A/cm$^2$ although the total film thickness of the $Bi_4Ti_3O_{12}$ thin film was 100 nm, which is very thin. This is because, as mentioned above, the dense ferroelectric $Bi_4Ti_3O_{12}$ thin film with excellent evenness suppresses the production of a pinhole, and the leakage current properties can be greatly promoted.

The following describes the second embodiment of the present invention. Here, for convenience of explanation, those members that have the same arrangement and functions, and that are described in the aforementioned embodiment 1 are indicated by the same reference numerals and the description thereof is omitted.

In the second embodiment, a $Bi_2Ti_2O_7$ (pyrochlore phase) thin film was used as the crystalline thin film 5, and a ferroelectric $Bi_4Ti_3O_{12}$ thin film composed of the same elements as those of the crystalline thin film 5 was used as the ferroelectric thin film 6.

As to production of a sample in the second embodiment, the $Bi_2Ti_2O_7$ thin film with the thickness of 5 nm and the ferroelectric $Bi_4Ti_3O_{12}$ thin film with the film thickness of 95 nm were successively formed on the Pt/Ta/SiO$_2$/Si substrate by the MOCVD method under the entirely same conditions as those of the embodiment 1 except that the substrate temperature of 600° C. at the time of forming the $Bi_4Ti_3O_{12}$ crystalline thin film in the first embodiment was changed to the substrate temperature of 450° C. In the second embodiment, the time required for forming the $Bi_2Ti_2O_7$ crystalline thin film was about 4 minutes, and the time required for forming the ferroelectric $Bi_4Ti_3O_{12}$ thin film was about 1 hour similarly to the first embodiment.

When the surface of the ferroelectric $Bi_4Ti_3O_{12}$ thin film in the second embodiment was examined by the SEM, a dense thin film whose evenness is excellent was obtained like that of the first embodiment. Moreover, according to the observation by the X-ray diffraction, in the second embodiment, diffraction patterns of the $Bi_2Ti_2O_7$ pyrochlore phase and the $Bi_4Ti_3O_{12}$ perovskite phase are shown. This is because the $Bi_2Ti_2O_7$ crystalline thin film (pyrochlore phase) functioned as an initial nuclear layer, and the $Bi_4Ti_3O_{12}$ perovskite phase grew on the ferroelectric $Bi_4Ti_3O_{12}$ thin film formed on the $Bi_2Ti_2O_7$ crystalline thin film.

Here, in the first or second embodiment, the substrate temperature at the time of forming the crystalline thin film 5 by means of the MOCVD method was 600° C. or 450° C., and the substrate temperature at the time of forming the ferroelectric thin film 6 was 400° C., but the substrate temperatures are not necessarily limited to them. In other words, when the crystalline thin film 5 and the ferroelectric thin film 6 were formed under the conditions that the substrate temperature at the time of forming the crystalline thin film 5 was in the rage of 450° C. to 650° C., the substrate temperature at the time of forming the ferroelectric thin film 6 was in the range of 400° C. to 500° C., and the substrate temperature at the time of forming the ferroelectric thin film was lower than the substrate temperature at the time of forming the crystalline thin film, a satisfactory result was obtained similarly to the first and second embodiments.

In the first or the second embodiment, the film thickness of the crystalline thin film 5 was 5 nm, and the film thickness of the ferroelectric thin film 6 was 95 nm, but they are not necessarily limited to these. Therefore, when the film thickness of the crystalline thin film 5 is in the rage of 5 nm to 10 nm, and the film thickness of the ferroelectric thin film 6 was in the range of 5 nm to 300 nm, the effects of the present invention can be sufficiently obtained.

In each embodiment, $Bi_4Ti_3O_{12}$ was used as the material of the ferroelectric material, but the material is not necessarily limited to this. Therefore, $SrBi_2Nb_2O_9$, $SrBi_2Ta_2O_9$, $BaBi_2Nb_2O_9$, $BaBi_2Ta_2O_9$, $PbBi_2Nb_2O_9$, $PbBi_2Ta_2O_9$, $SrBi_4Ti_4O_{15}$, $BaBi_4Ti_4O_{15}$, $PbBi_4Ti_4O_{15}$, $Na_{0.5}Bi_{4.5}Ti_4O_{15}K_{0.5}Bi_{4.5}Ti_4O_{15}$, $Sr_2Bi_4Ti_5O_{18}$, $Ba_2Bi_4Ti_5O_{18}$, $Pb_2Bi_4Ti_5O_{18}$, etc. which are Bi ferroelectric materials having the same layered perovskite structure can be applied to the present invention. Moreover, beside the above materials, PZT, PLZT, $SrTiO_3$ (STO), $Ba_{1-x}Sr_xTiO_3$ (BST) are also applicable to the present invention as the materials of the ferroelectrics.

In each embodiment, the capacitor structure element uses the Pt/Ta/SiO$_2$/Si substrate as the substrate, but such a substrate is not necessarily limited to this. For example, the capacitor structure element may be arranged so that an integrated circuit is formed on a Si or GaAs substrate, the surface of the integrated circuit is covered with an layer insulating film made of silicon oxide, silicon nitride, etc., an electrode layer, which is electrically connected to an element of the integrated circuit through a contact hole formed on one portion of the layer insulating film, is formed on the layer insulating film, and the ferroelectric thin film of the present invention is formed on the electrode layer. In other words, the present invention is applicable to an integrated circuit element which is electrically connected to an element of an integrated circuit, which have the capacitor structure of the above embodiments and a transistor structure, and various highly integrated devices.

Since the ferroelectric thin film coated substrate in each embodiment can realize the ferroelectric thin film with satisfactory evenness and denseness which has the sufficient ferroelectric properties, even if the film thickness is 100 nm that is extremely thin, the leakage current properties can be greatly improved. Furthermore, the ferroelectric thin film coated substrate can correspond to various fine processing, and it is effective for the application to the highly integrated devices.

In addition, since the method for producing the ferroelectric thin film according to each embodiment makes it possible to form the ferroelectric thin film with satisfactory crystallinity at the low temperature of 400° C. as mentioned above mostly in the forming process of the ferroelectric thin film, the ferroelectric thin film is applicable to the highly integrated devices. Moreover, since not the conventional film coating and forming methods, such as the MOD method and the sol-gel method, but the MOCVD method is used, the ferroelectric thin film with a large area and satisfactory controllability of its film thickness can be produced at a high speed, thereby making it possible to greatly improve the productivity.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A ferroelectric thin film coated substrate, comprising:

a substrate;

a crystalline thin film formed on said substrate at a first substrate temperature at which crystal grows; and a ferroelectric thin film formed on said crystalline thin film at a second substrate temperature which is lower than the first substrate temperature, wherein a particle diameter of crystal grains composing said crystalline thin film is smaller than a particle diameter of crystal grains composing said ferroelectric thin film, so as to promote crystal growth in said ferroelectric thin film and make the particle diameter of crystal grains composing said ferroelectric thin film sufficiently small.

2. The ferroelectric thin film coated substrate as defined in claim 1, wherein the particle diameter of crystal grains composing said crystalline thin film is approximately 5 nm.

3. The ferroelectric thin film coated substrate as defined in claim 1, wherein a film thickness of said crystalline thin film is smaller than a film thickness of said ferroelectric thin film.

4. The ferroelectric thin film coated substrate as defined in claim 3, wherein:

the film thickness of said crystalline thin film is in the range of 5 nm to 10 nm, the thickness of said ferroelectric thin film is greater than the thickness of said crystalline thin film but less than 300 nm.

5. The ferroelectric thin film coated substrate as defined in claim 1, wherein at least one of constituent elements of said crystalline thin film is same as one of constituent elements of said ferroelectric thin film.

6. The ferroelectric thin film coated substrate as defined in claim 5, wherein said crystalline thin film is composed of bismuth titanate and the ferroelectric thin film is composed of bismuth titanate.

7. The ferroelectric thin film coated substrate as defined in claim 6, wherein said crystalline thin film and said ferroelectric thin film are made of $Bi_4Ti_3O_{12}$ with random orientation including a-axis orientation.

8. The ferroelectric thin film coated substrate as defined in claim 6, wherein said crystalline thin film is made of $Bi_2Ti_2O_7$ and said ferroelectric thin film is made of $Bi_4Ti_3O_{12}$.

9. The ferroelectric thin film coated substrate as defined in claim 1, wherein said ferroelectric thin film is composed of a Bi ferroelectric material having a layered perovskite structure.

10. The ferroelectric thin film coated substrate as defined in claim 1, wherein said ferroelectric thin film is composed of a material which is selected from a group of PZT, PLZT, $SrTiO_3$ and $Ba_{1-x}Sr_xTiO_3$.

11. The ferroelectric thin film coated substrate as defined in claim 1, wherein:

the first substrate temperature is in the range of 450° C. to 650° C., and the second substrate temperature is in the range of 400° C. to 500° C., with the proviso that the second substrate temperature is lower than and the first substrate temperature.

12. A capacitor structure element, comprising:

a substrate;

a crystalline thin film formed on a substrate at a first substrate temperature at which crystal grows;

a ferroelectric thin film formed on said crystalline thin film at a second substrate temperature, which is lower than the first substrate temperature, wherein a particle diameter of crystal grains composing said crystalline thin film is smaller than a particle diameter of crystal grains composing said ferroelectric thin film, so as to promote crystal growth in said ferroelectric thin film and make the particle diameter of crystal grains composing said ferroelectric thin film sufficiently small;

a lower electrode made of a conductive material, which is formed between said substrate and said crystalline thin film; and an upper electrode made of a conductive material, which is formed on said ferroelectric thin film.

13. A ferroelectric thin film coated substrate, comprising:

a substrate;

a crystalline thin film formed on said substrate; and a ferroelectric thin film formed on said crystalline thin film, wherein a particle diameter of crystal grains composing said crystalline thin film is smaller than a particle diameter of crystal grains composing said ferroelectric thin film, so as to promote crystal growth in said ferroelectric thin film and make the particle diameter of crystal grains composing said ferroelectric thin film sufficiently small.

* * * * *